United States Patent [19]

Ohtsuka

[11] Patent Number: 5,034,647
[45] Date of Patent: Jul. 23, 1991

[54] INCHWORM TYPE DRIVING MECHANISM

[75] Inventor: Masaru Ohtsuka, Yokohama, Japan

[73] Assignee: Canon Kabushiki Kaisha, Tokyo, Japan

[21] Appl. No.: 412,104

[22] Filed: Sep. 25, 1989

[30] Foreign Application Priority Data

Sep. 29, 1988 [JP] Japan .................................. 63-242572

[51] Int. Cl.⁵ ........................................... H01L 41/08
[52] U.S. Cl. .................................................. 310/328
[58] Field of Search ......................... 310/321, 323, 328

[56] References Cited

U.S. PATENT DOCUMENTS

| | | | |
|---|---|---|---|
| 4,455,501 | 6/1984 | Tojo et al. | 310/328 |
| 4,585,969 | 4/1986 | Tanaka | 310/328 |
| 4,714,855 | 12/1987 | Fujimoto | 310/328 |
| 4,777,398 | 10/1988 | Shibuya | 310/328 |
| 4,850,709 | 7/1989 | Ban et al. | 356/352 |
| 4,887,404 | 12/1989 | Ohtsuka | 269/73 |

FOREIGN PATENT DOCUMENTS 0131985 8/1978 Fed. Rep. of Germany ...... 310/328

Primary Examiner—Mark O. Budd
Attorney, Agent, or Firm—Fitzpatrick, Cella, Harper & Scinto

[57] ABSTRACT

An inchworm type driving mechanism usable as a fine positioning device is disclosed. The mechanism includes at least two clamps for clamping a movable member, and an expansible/contractable device for driving the movable member. Each clamp includes a plurality of levers each having a pivot provided by a resilient hinge and an electrostrictive device disposed between end portions of the levers. Through the actuation of the electrostrictive device, the other end portions of the levers sandwich the opposite sides of the movable member to clamp the same. In one preferred form, each clamp is supported by a support, with low rigidity in the clamping direction, but with high rigidity in a direction perpendicular to the clamping direction. Thus, undesirable deformation or distortion of the movable member can be avoided and, therefore, high-precision positioning of the movable member is assured.

2 Claims, 3 Drawing Sheets

INCHWORM TYPE DRIVING MECHANISM

FIELD OF THE INVENTION AND RELATED ART

This invention relates to an inchworm type driving mechanism suitably applicable to a fine positioning device which can be used in many varieties of apparatuses, such as a semiconductor device manufacturing exposure apparatus, for example an.

FIGS. 3A and 3B show an example of inchworm type actuator (driving mechanism) having been used conventionally. FIG. 3A is a top plan view, and FIG. 3B is a fragmentary section of a clamping device 3 (3'). As shown in FIG. 3B, the clamping device 3 (3') includes an electrostrictive device 4 (4') and a lever mechanism 30 (30'). By the expansion/contraction of this electrostrictive device 4 (4'), a movable member 1 (1') is pressed against a stationary member 21 (21') by which it is clamped.

The movable members 1 and 1' are driven in the manner such as described below. By way of example, it is now assumed that in FIG. 3A the movable members 1 and 1' are going to be driven clockwise.

First, in a state wherein the clamping device 3 is operating, an expansible/contractable device 5 is contracted while another expansible/contractable device 5' is expanded. By this, the movable member 1' is driven clockwise with the movable member 1 being fixed. Then, in this state, the clamping device 3' is actuated to hold the movable member 1' immovable, and the clamping device 3 is deactuated. Then, the expansible/contractable device 5 is expanded, whereas the expansible/contractable device 5' is contracted. As a result, the movable member 1 is driven clockwise. Further, the first-actuated clamping device 3 is actuated again, while the other clamping device 3' is deactuated. By repeating these operations, the movable members 1 and 1' are driven. The movable members can be driven in an opposite direction, in a similar manner.

SUMMARY OF THE INVENTION

In the conventional example described above, however, the clamping is done by pressing each movable member against a stationary member by a strong force. This results in a disadvantage of minute deformation or distortion of the movable member or, alternatively, inclination of an article placed on the movable member for positioning of the same.

It is accordingly an object of the present invention to provide an inchworm type driving mechanism by which a movable member can be driven substantially without deformation or distortion of the movable member, or without inclination of an article placed on the movable member for positioning of the same.

To achieve the above object, an inchworm type driving mechanism according to the present invention comprises a clamping means for clamping a movable member, wherein the clamping means includes a plurality of lever members which are swingable to be pressed against opposite sides of the movable member to clamp the same.

With this structure, the movable member can be gripped and clamped by the lever members swung to be pressed against the opposite sides of the movable member. Therefore, once the clearances at the opposite sides of the movable member are adjusted so as to be equal to each other, no useless force is applied to the movable member. Consequently, inclination or distortion of the movable member does not take place.

Adjustment of the clearances at the opposite sides of the movable member is not always necessary. That is, the clamping means may be supported by a supporting base with a low rigidity with respect to the clamping direction but with a high rigidity in a direction perpendicular to the clamping direction, this being made by the use of a leaf spring means or a resilient hinge linkage means, for example. On that occasion, the movable member clamped by the clamping means is held tightly in the direction perpendicular to the clamping direction while it is held loosely in the clamping direction. Thus, without the necessity of such a high precision adjustment of the height of the clamping means, the above-described effects are obtainable.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B show an inchworm type driving mechanism according to a first embodiment of the present invention, wherein FIG. 1A is a partial sectional top plan view and FIG. 1B is a longitudinal section.

FIGS. 2A and 2B show an inchworm type driving mechanism according to a second embodiment of the present invention, wherein FIG. 2A is a partial sectional top plan view and FIG. 2B is a longitudinal section.

FIGS. 3A and 3B show a conventional inchworm type driving mechanism, wherein FIG. 3A is a top plan view and FIG. 3B is a fragmentary section.

DESCRIPTION OF THE PREFERRED EMBODIMENTS

Figure 1A:
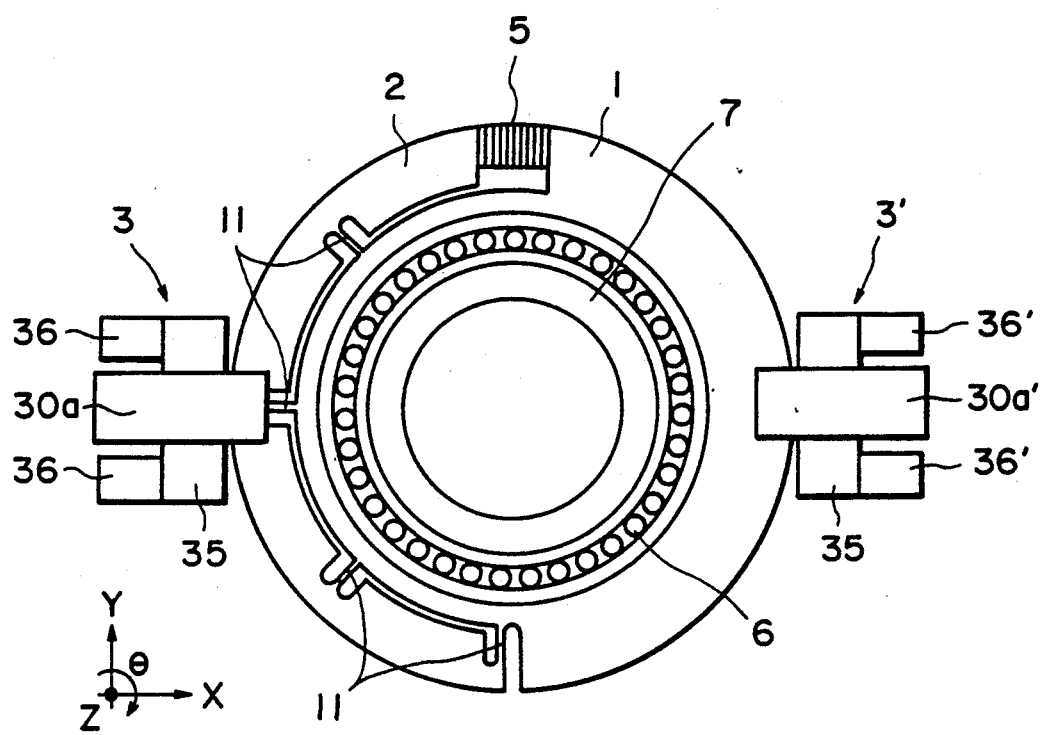
Figure 1B:
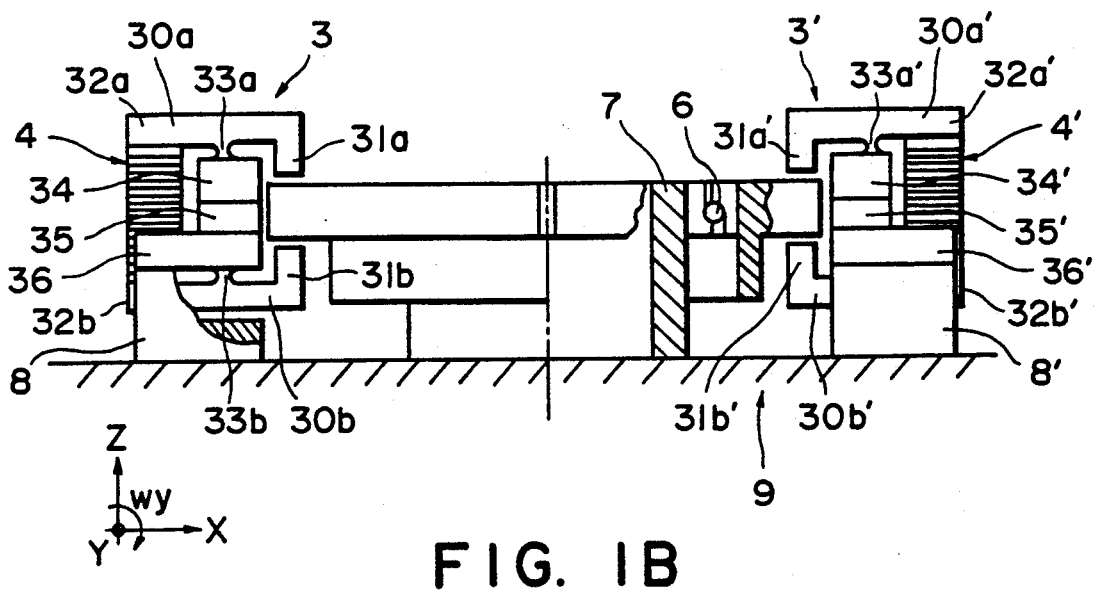

FIGS. 1A and 1B show an inchworm type driving mechanism according to one embodiment of the present invention. FIG. 1A is a top plan view and FIG. 1B is a partial sectional side view. In FIGS. 1A and 1B, denoted at 1 and 2 are movable members which are coupled to each other by means of four leaf springs 11. The leaf springs 11 are provided between the movable members 1 and 2 and are disposed at a regular pitch along a circumferential direction ($\theta$ direction). These leaf springs 11 are formed integrally with the movable members 1 and 2, and they can be deformed resiliently in the circumferential direction. Denoted at 3 and 3' are clamping devices for clamping the movable members 1 and 2, respectively; at 4 and 4' are electrostrictive devices which are expansible/contractable in the Z direction to actuate/deactuate the clamping devices 3 and 3'; at 5 is an electrostrictive device which is operable to cause a relative circumferential displacement between the movable members 1 and 2; and at 6 is a bearing means for supporting the movable members 1 and 2 to a stationary member 7 which is fixed to a supporting base 9. The bearing means 6 has an inner race contacted to the stationary member 7. Denoted at 8 and 8' are stationary tables by which the clamping devices 3 and 3' are fixed to the supporting base 9. Through the bearing means 6, the movable members 1 and 2 can be freely rotationally moved in the circumferential direction, relative to the supporting base 9.

Details of the structure of the clamping devices 3 and 3' will now be explained. Since the clamping devices 3 and 3' have the same structure, the following explanation will be made only to the clamping device 3, and explanation of the structure of the other clamping device 3' will be omitted, by assigning to the corresponding elements the same reference numerals with primes.

In FIG. 1B, denoted at 30a and 30b are lever arms which are swingable in a rotational direction (wy direction) about the Y axis, relative to a supporting block 34. Resilient hinges 33a and 33b are formed integrally with the supporting block 34 and with the lever arms 30a and 30b, respectively. Through these resilient hinges 33a and 33b, the lever arms 30a and 30b are supported by the block 34. Each of the lever arms 30a and 30b has an end portion 31a or 31b which is bent approximately at a right angle in the Z-axis direction, such that the free end of the end portion is contactable to the top or bottom surface of the movable member 2 (the movable member 1 in the case of the clamping device 3'). An electrostrictive device 4 is provided between the other end portions 32a and 32b of the lever arms 30a and 30b. By the expansion/contraction of this electrostrictive device 4, the lever arms 30a and 30b can be swingingly moved in the wy direction about the pivots of the resilient hinges 33a and 33b, respectively. Denoted at 35 and 36 are mounting members for mounting the block 34 to the stationary table 8.

In operation, first, an electric voltage is applied to the electrostrictive device 4' to cause expansion of the same. As a result of this expansion, the lever arms 30a' and 30b' of the clamping device 3' are rotationally displaced counterclockwise and clockwise, respectively, whereby the movable member 1 is clamped by the end portions 31a' and 31b' of the lever arms 30a' and 30b', respectively, from above and from below. When, in this state, an electric voltage is applied to the electrostrictive device 5, the movable member 2 is displaced minutely in the circumferential direction (θ direction), with the leaf springs 11 functioning as a guide. Subsequently, in this state, an electric voltage is applied to the electrostrictive device 5 to cause expansion of the same. As a result of this expansion, the lever arms 30a and 30b of the clamping device 3 are rotationally displaced clockwise and counterclockwise, respectively, whereby the movable member 2 is clamped by the free end portions 31a and 31b of the arms 30a and 30b, respectively. After this, application of an electric voltage to the electrostrictive device 4', which is operating at this time, is stopped to cause contraction of the electrostrictive device 4', to release the clamping operation of the clamping device 3'. When, after this, application of an electric voltage to the electrostrictive device 5 is also stopped, the movable member 1 displaces minutely in the circumferential direction (θ direction), with the bearing means 6 functioning as a guide. Then, in this state, an electric voltage is applied again to the electrostrictive device 4' to actuate the clamping device 3' in a similar way to clamp the movable member 1. Thereafter, application of an electric voltage to the electrostrictive device 4 is stopped to cause contraction of the same to release the clamping device 3. Thus, the initial state of the clamping system is resumed. During the period of the above-described operations, the movable members 1 and 2 are rotationally displaced by a small amount. Accordingly, by repeating the above-described operations, the movable members 1 and 2 can be rotationally displaced in one direction. It will be readily understood that, for rotational displacement in an opposite direction, the timing of the voltage application to the clamping devices 3 and 3' is reversed.

In the present embodiment, the clamping devices 3 and 3' each operate to sandwich the movable member 1 or 2 in the vertical direction. Thus, once the height of the stationary table 8 (8') is made adjustable to make uniform the clearances between the clamping device 3 (3') and the movable member 2 (1) as the clamping device is deactuated, that is, the clearance between the free end 31a (31a') of the lever arm 30a (30a') and the top surface of the movable member 2 (1) in the Z-axis direction and the clearance between the free end 31b (31b') of the lever arm 30b (30b') and the bottom surface of the movable member 2 (1) in the Z-axis direction as the clamping device is deactuated, the result is that, at the time of clamping even forces are applied upwardly and downwardly (in the Z-axis direction) to the movable members 1 and 2. Therefore, it is possible to avoid distortion of the movable members, or inclination of those members, with respect to the X-Y plane.

Further, since the clamping device 3 (3') is structured so that the displacement of the electrostrictive device 4 (4') is transmitted to the clamping arm free ends 31a and 31b (31a' and 31b') through a lever mechanism having pivots of resilient hinges 33a and 33b (33a' and 33b'), respectively, there is no loss of displacement due to play. Therefore, the structure is advantageous with respect to reduction in size.

Further, the clamping device 3 (3') can be fabricated by using separate parts such as at 34, 35 and 36 (34', 35' and 36'). Accordingly, the fine adjustment of clearances between the free ends of the lever arms of the clamping devices 3 and 3' and the movable members 1 and 2 may conveniently be made by adjusting the thickness of an intermediate element 35 (35') or by using an interposal metal foil.

Figure 2A:
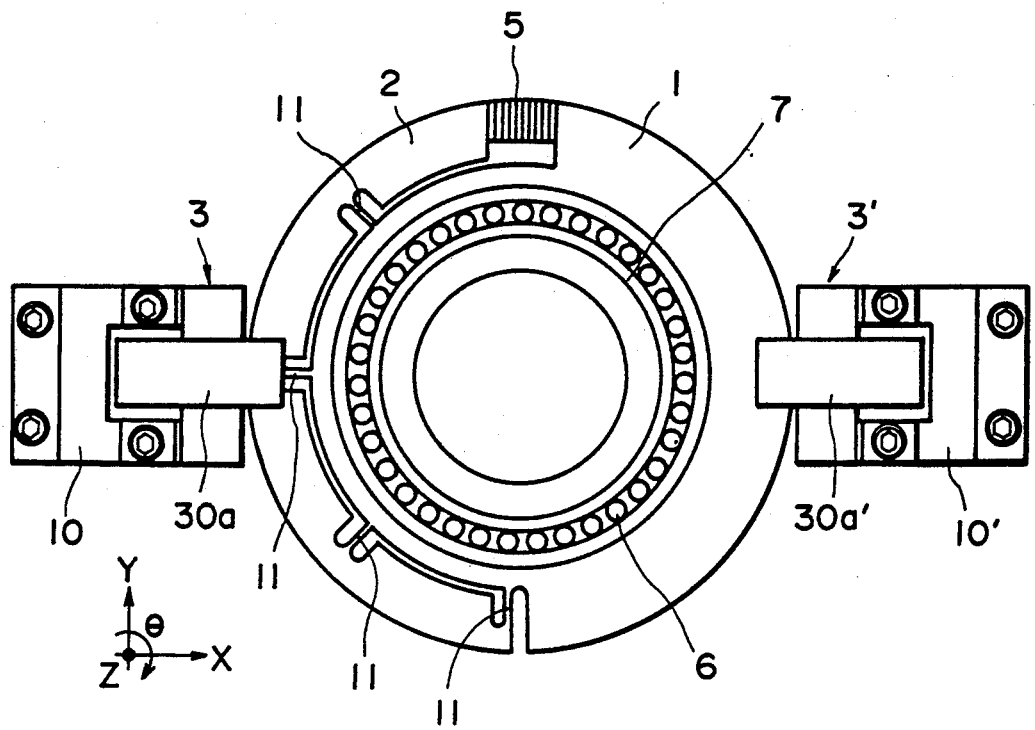
Figure 2B:
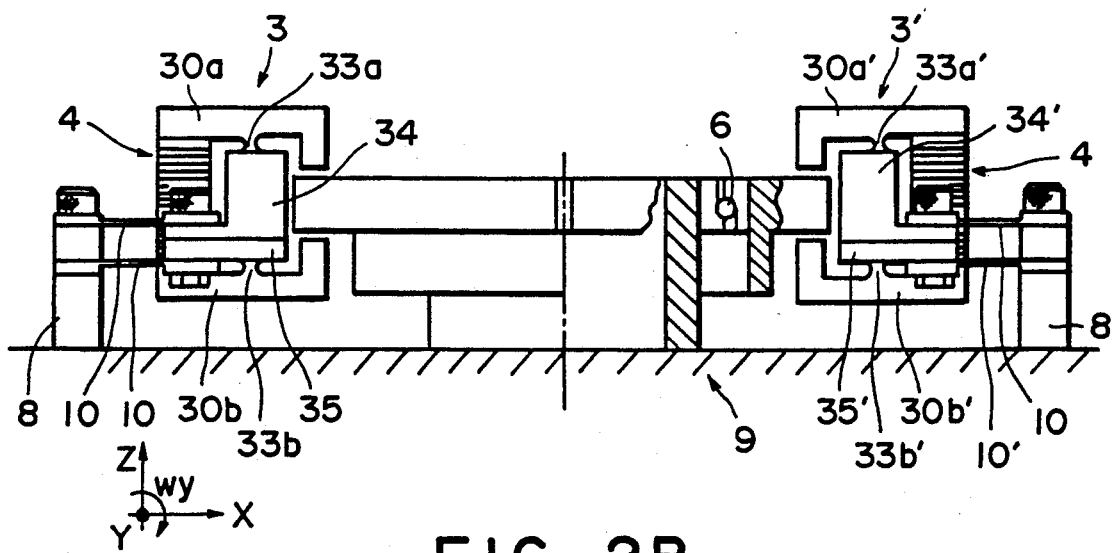
Figure 3A:
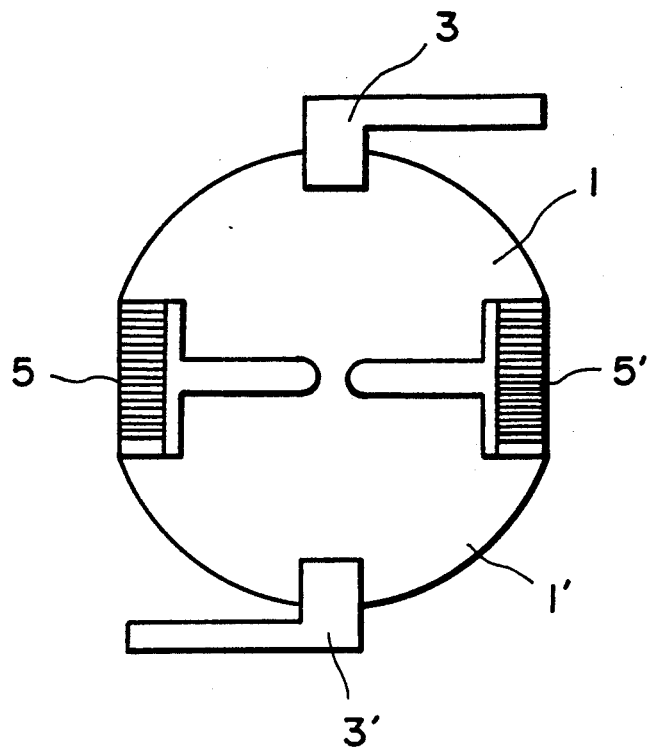
Figure 3B:
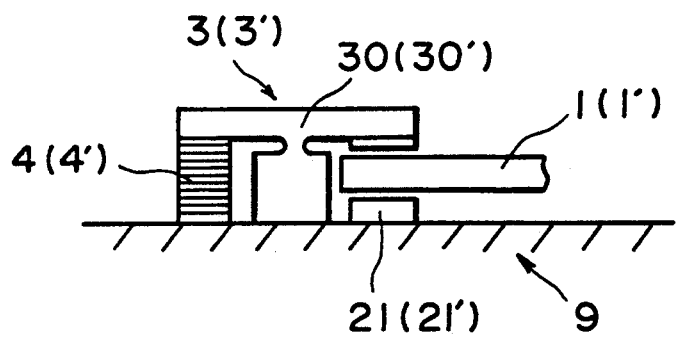

FIGS. 2A and 2B show an inchworm type driving mechanism according to a second embodiment of the present invention. FIG. 2A is a top plan view and FIG. 2A is a partial sectional side view. The same reference numerals are assigned to the elements the same as or corresponding to those of the FIG. 1 mechanism.

In FIGS. 2A and 2B, clamping devices 3 and 3' include upper arms 30a and 30a' and lower arms 30b and 30b'. The upper arms 30a and 30a' are coupled to members 34 and 34' through resilient hinges 33a and 33a', respectively. Similarly, the lower arms 30b and 30b' are coupled to members 35 and 35' through resilient hinges 33b and 33b', respectively. The member 34 (34') and the member 35 (35') are coupled into an integral structure and, in this coupled state, they are supported to a supporting base 9 by means of parallel leaf spring means 10 (10') which is deformable in the Z-axis direction. Since, as described, each of the clamping devices 3 and 3' is supported by two parallel leaf springs 10 (10'), it can move in the clamping direction, (Z-axis direction) relatively freely, but it is supported with high rigidity in the rotational direction (θ direction) of the movable member 1 or 2, i.e. in a direction parallel to the X-Y plane. Accordingly, with the structure described above, the adjustment of making uniform the upper and lower clearances between the free end of each lever arm of the clamping device 3 (3') and the movable member 2 (1) becomes unnecessary.

In the mechanism shown in FIG. 2, the member 34 (34') and the member 35 (35') are coupled into an integral structure which is supported by two parallel leaf springs 10 (10'). However, the members 34 and 35 (34' and 35') may be separated and supported separately by upper and lower leaf springs, respectively.

Also, similar support is attainable by using a linkage mechanism having an elastic hinge.

In the inchworm type driving mechanism according to the present invention, as described hereinbefore, a clamping means of the type having movable arms which can be pressed against the opposite sides of a movable member, is used. Therefore, it is possible to avoid undesirable minute deformation, distortion or inclination of the movable member.

Further, in one preferred form, the clamping means is weak in the clamping direction but provides rigid support in a direction perpendicular to the clamping direction. This provides an advantage of easier adjustment of the clearance between the clamping member and the movable member.

While the invention has been described with reference to the structures disclosed herein, it is not confined to the details set forth and this application is intended to cover such modifications or changes as may come within the purposes of the improvements or the scope of the following claims.

What is claimed is:

1. An inchworm type driving mechanism, comprising:
   a movable member having first and second movable portions which are coupled to each other through a resilient element;
   a first clamp having a plurality of movable arms for selectively pressing against opposite sides of the first movable portion of the movable member to clamp the first movable portion in a clamping direction;
   a second clamp having a plurality of movable arms for selectively pressing against opposite sides of the second movable portion of the movable member to clamp the second movable portion in a clamping direction;
   supporting means for supporting each of said first and second clamps, said supporting means having a low rigidity with respect to the movable member in the clamping direction and a high rigidity in a direction perpendicular to the clamping direction; and
   an expansible and contractible element for causing relative displacement between the first and second movable portions of the movable member.

2. A mechanism according to claim 1, wherein said supporting means comprises a parallel leaf spring mechanism.

* * * * *

UNITED STATES PATENT AND TRADEMARK OFFICE
CERTIFICATE OF CORRECTION

PATENT NO. : 5,034,647

DATED : July 23, 1991

INVENTOR(S) : Masaru Ohtsuka

It is certified that error appears in the above-identified patent and that said Letters Patent is hereby corrected as shown below:

On the title page and column 1, line 1

IN THE TITLE

"INCHWORN TYPE DRIVING MECHANISM" should read --INCREMENTAL TYPE DRIVING MECHANISM--.

On the title page;
IN THE FOREIGN PATENT DOCUMENTS

"Fed. Rep. of Germany" should read --Dem. Rep. of Germany--.

IN THE ABSTRACT

Line 1

"inchworm" should read --incremental--.

UNITED STATES PATENT AND TRADEMARK OFFICE
CERTIFICATE OF CORRECTION

PATENT NO. : 5,034,647
DATED : July 23, 1991
INVENTOR(S) : Masaru Ohtsuka

It is certified that error appears in the above-identified patent and that said Letters Patent is hereby corrected as shown below:

COLUMN 1

Line 1, "INCHWORM" should read --INCREMENTAL--;
Line 6, "inchworm" should read --incremental--;
Line 10, "example an." should read --example.--;
Line 11, "of inchworm" should read --of an incremental--;
Line 51, "inchworm" should read --incremental--; and
Line 56, "inchworm" should read --incremental--.

COLUMN 2

Line 25, "inchworm" should read --incremental--;
Line 29, "inchworm" should read --incremental--;
Line 33, "inchworm" should read --incremental--; and
Line 39, "inchworm" should read --incremental--.

COLUMN 4

Line 37, "inchworm" should read --incremental--.

UNITED STATES PATENT AND TRADEMARK OFFICE
CERTIFICATE OF CORRECTION

PATENT NO. : 5,034,647
DATED : July 23, 1991
INVENTOR(S) : Masaru Ohtsuka

It is certified that error appears in the above-identified patent and that said Letters Patent is hereby corrected as shown below:

COLUMN 5

Line 3, "Also, similar" should read --Also, a similar--;
Line 5, "inchworm" should read --incremental--; and
Line 13, "direction" should read --direction,--.

COLUMN 6

Line 1, "inchworm" should read --incremental--;
Line 21, "contractible" should read --contractable--.

Signed and Sealed this

Sixteenth Day of February, 1993

Attest:

STEPHEN G. KUNIN

Attesting Officer

Acting Commissioner of Patents and Trademarks